United States Patent
Zhou et al.

(10) Patent No.: US 9,847,428 B1
(45) Date of Patent: Dec. 19, 2017

(54) OXIDE SEMICONDUCTOR DEVICE

(71) Applicant: UNITED MICROELECTRONICS CORP., Hsin-Chu (TW)

(72) Inventors: Zhibiao Zhou, Singapore (SG); Ding-Lung Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/230,496

(22) Filed: Aug. 8, 2016

(51) Int. Cl.
*H01L 29/786* (2006.01)
*H01L 29/417* (2006.01)

(52) U.S. Cl.
CPC .. *H01L 29/78648* (2013.01); *H01L 29/41733* (2013.01); *H01L 29/7869* (2013.01); *H01L 29/78696* (2013.01)

(58) Field of Classification Search
CPC ......... H01L 29/78648; H01L 29/78642; H01L 29/42384; H01L 29/4908; H01L 29/513; H01L 29/66765; H01L 29/78618; H01L 29/78645; H01L 29/78696; H01L 29/41733; H01L 29/7869; H01L 29/42392; H01L 27/1251; H01L 27/088; H01L 27/1156; H01L 27/1222; H01L 2029/42388; H01L 21/02554; H01L 21/02565
USPC .......................................................... 257/43
See application file for complete search history.

(56) References Cited

U.S. PATENT DOCUMENTS

| | | | | |
|---|---|---|---|---|
| 5,567,959 A | * | 10/1996 | Mineji | H01L 27/0688 257/350 |
| 8,981,367 B2 | | 3/2015 | Yoneda | |
| 2012/0146713 A1 | * | 6/2012 | Kim | H01L 29/41733 327/530 |
| 2013/0240886 A1 | * | 9/2013 | Yeh | H01L 27/1222 257/57 |
| 2014/0175423 A1 | * | 6/2014 | Jeong | H01L 29/66969 257/43 |
| 2015/0179810 A1 | | 6/2015 | Yamazaki | |
| 2016/0049523 A1 | * | 2/2016 | Yamada | H01L 29/42384 250/370.08 |
| 2016/0284858 A1 | * | 9/2016 | Yamazaki | H01L 29/42392 |

* cited by examiner

*Primary Examiner* — Eric Ward
*Assistant Examiner* — Eric Ashbahian
(74) *Attorney, Agent, or Firm* — Winston Hsu

(57) ABSTRACT

An oxide semiconductor device includes an oxide semiconductor transistor including a first gate electrode, a second gate electrode, a third gate electrode, a first oxide semiconductor channel layer, a second oxide semiconductor channel layer, and two source/drain electrodes. The second gate electrode is disposed above the first gate electrode. The third gate electrode is disposed above the second gate electrode. At least a part of the first oxide semiconductor channel layer is disposed between the first gate electrode and the second gate electrode. At least a part of the second oxide semiconductor channel layer is disposed between the second gate electrode and the third gate electrode. At least a part of each source/drain electrode is disposed between the first oxide semiconductor channel layer and the second oxide semiconductor channel layer. Each source/drain electrode contacts the first oxide semiconductor channel layer and the second oxide semiconductor channel layer.

14 Claims, 5 Drawing Sheets

US 9,847,428 B1

OXIDE SEMICONDUCTOR DEVICE

BACKGROUND OF THE INVENTION

1. Field of the Invention

The present invention relates to an oxide semiconductor device, and more particularly, to an oxide semiconductor device including a dual channel oxide semiconductor transistor.

2. Description of the Prior Art

Oxide semiconductor materials, such as indium gallium zinc oxide (IGZO), have been applied in thin film transistors (TFTs) of display devices and field effect transistors (FETs) used in integrated circuits because of properties such as high mobility and low leakage current. However, although the leakage current of the transistor including the oxide semiconductor layer is relatively low, the application field of the present oxide semiconductor transistor is still limited because the threshold voltage (Vt) of the oxide semiconductor transistor is still too high and the on-current ($I_{on}$) of the oxide semiconductor transistor is not high enough for some application such as low power devices. For example, the gate insulation layer in the oxide semiconductor transistor has to be thick enough for keeping low leakage current and the on-current is limited by the thicker gate insulation layer. The gate voltage (Vg) and the drain voltage (Vd) are too high because of the relatively higher threshold voltage of the oxide semiconductor transistor, and the oxide semiconductor transistor, cannot be applied in the low power devices accordingly. Therefore, it is an important subject for the related industries to improve the electrical performances of the oxide semiconductor transistor without deteriorating the original property of low leakage current.

SUMMARY OF THE INVENTION

It is one of the objectives of the present invention to provide an oxide semiconductor device. An oxide semiconductor transistor in the oxide semiconductor device includes two oxide semiconductor channel layers and three gate electrode for enhancing on-current of the oxide semiconductor transistor. The application field of the oxide semiconductor device may be increased accordingly.

An oxide semiconductor device is provided in an embodiment of the present invention. The oxide semiconductor device includes an oxide semiconductor transistor. The oxide semiconductor transistor includes a first gate electrode, a second gate electrode, a third gate electrode, a first oxide semiconductor channel layer, a second oxide semiconductor channel layer, and two source/drain electrodes. The second gate electrode is disposed above the first gate electrode, and the third gate electrode is disposed above the second gate electrode. At least a part of the first oxide semiconductor channel layer is disposed between the first gate electrode and the second gate electrode, and at least a part of the second oxide semiconductor channel layer is disposed between the second gate electrode and the third gate electrode. At least a part of each of the source/drain electrodes is disposed between the first oxide semiconductor channel layer and the second oxide semiconductor channel layer. Each of the source/drain electrodes contacts the first oxide semiconductor channel layer and the second oxide semiconductor channel layer These and other objectives of the present invention will no doubt become obvious to those of ordinary skill in the art after reading the following detailed description of the preferred embodiment that is illustrated in the various figures and drawings.

DETAILED DESCRIPTION

Figure 1:
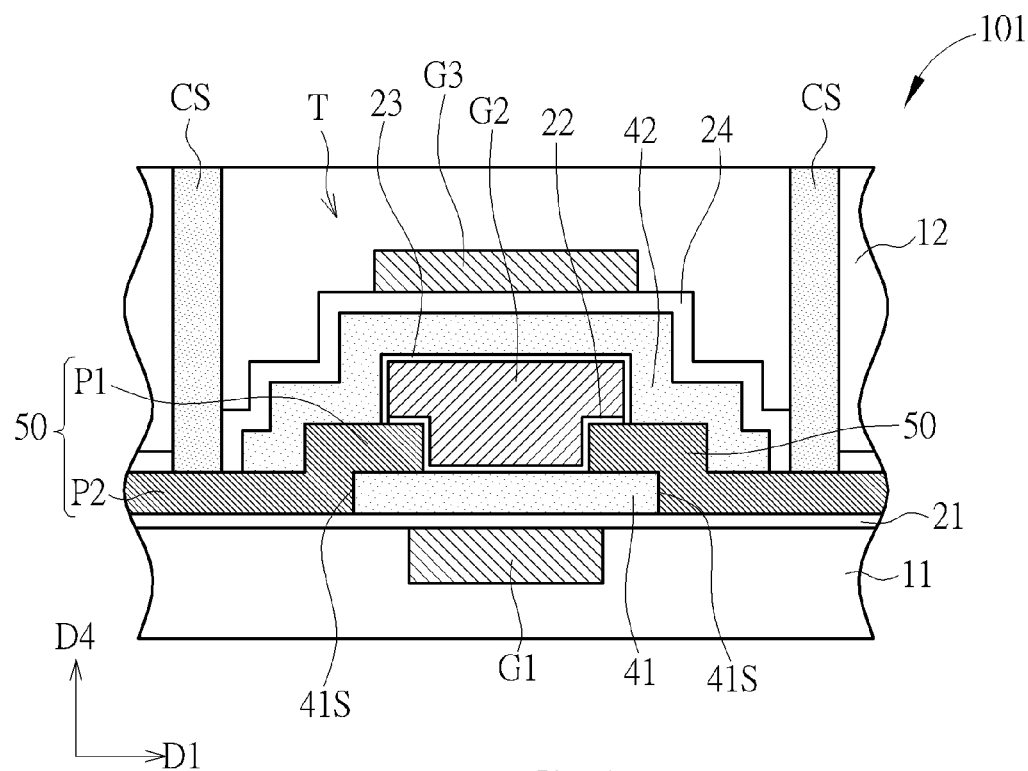
FIG. 1 is a schematic drawing illustrating an oxide semiconductor device according to a first embodiment of the present invention.
Figure 2:
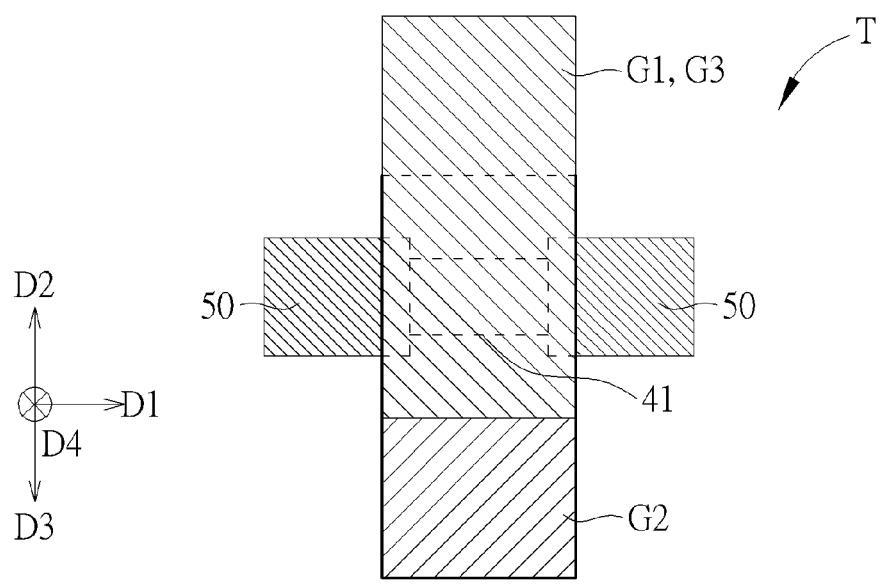
FIG. 2 is a top view diagram of an oxide semiconductor transistor according to the first embodiment of the present invention.

Please refer to FIG. 1 and FIG. 2. FIG. 1 is a schematic drawing illustrating an oxide semiconductor device according to a first embodiment of the present invention. FIG. 2 is a top view diagram of an oxide semiconductor transistor in this embodiment. As shown in FIG. 1 and FIG. 2, an oxide semiconductor device 101 is provided in this embodiment. The oxide semiconductor device 101 includes an oxide semiconductor transistor T, and the oxide semiconductor transistor T includes a first gate electrode G1, a second gate electrode G2, a third gate electrode G3, a first oxide semiconductor channel layer 41, a second oxide semiconductor channel layer 41, and two source/drain electrodes 50. The second gate electrode G2 is disposed above the first gate electrode G1, and the third gate electrode G3 is disposed above the second gate electrode G2. In other words, the first gate electrode G1, the second gate electrode G2, and the third gate electrode G3 are stacked in a vertical direction D4, and the second gate electrode G2 is disposed between the first gate electrode G1 and the third gate electrode G3 in the vertical direction D4. The oxide semiconductor transistor T may be regarded as a triple gate structure, the first gate electrode G1 may be regarded as a bottom gate, the second gate electrode G2 may be regarded as a middle gate, and the third gate electrode G3 may be regarded as a top gate, but the present invention is not limited to this. In some embodiments of the present invention, the oxide semiconductor transistor may also include more than three gate electrodes. In this embodiment, at least a part of the first oxide semiconductor channel layer 41 is disposed between the first gate electrode G1 and the second gate electrode G2, and at least a part of the second oxide semiconductor channel layer 42 is disposed between the second gate electrode G2 and the third gate electrode G3. At least a part of each of the source/drain electrodes 50 is disposed between the first oxide semiconductor channel layer 41 and the second oxide semiconductor channel layer 42. Each of the source/drain electrodes 50 contacts the first oxide semiconductor channel layer 41 and the second oxide semiconductor channel layer 42. For example, a bottom surface of each of the source/drain electrodes 50 may directly contact the first oxide semiconductor channel layer 41, and a top surface of each of the source/drain electrodes may directly contact the second oxide semiconductor channel layer 42, but not limited thereto.

The oxide semiconductor transistor T in this embodiment may be regarded as a dual channel oxide semiconductor transistor. The on-current ($I_{on}$) of the oxide semiconductor transistor T may be enhanced when the first oxide semiconductor channel layer 41 and the second oxide semiconductor channel layer 41 are driven by the first gate electrode G1, the second gate electrode G2, and the third gate electrode G3. Voltages applied to the first gate electrode G1, the second gate electrode G2, and the third gate electrode G3 may be identical or different from one another. For example, the third gate electrode G3 and the first gate electrode G1 may be used to provide bias voltage for adjusting the threshold voltage (Vt) of the oxide semiconductor transistor T, and the second gate electrode G2 may be applied voltage or be electrically floating. As shown in FIG. 2, the source/drain electrodes may be disposed on two sides of the first oxide semiconductor channel layer 41 in a first direction D1, the first gate electrode G1 and the third gate electrode G3 may extend in a second direction D2, and the second gate electrode G2 may extend in a third direction D3. The second direction D2 and the third direction D3 may be orthogonal to the first direction D1, and the second direction D2 may be opposite to the third direction, but not limited thereto. In other words, the second gate electrode G2 may extend in a different direction for being connected to a different voltage source, and the first gate electrode G1 and the third gate electrode G3 may be connected to the same voltage source, but the present invention is not limited to this.

In some embodiments of the present invention, the materials of the first gate electrode G1, the second gate electrode G2, the third gate electrode G3, and the source/drain electrodes 50 may include aluminum (Al), copper (Cu), tungsten (W), molybdenum (Mo), titanium (Ti), tantalum (Ta), or other appropriate conductive materials. The first oxide semiconductor channel layer 41 and the second oxide semiconductor channel layer 42 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, SnSbO2), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto.

As shown in FIG. 1 and FIG. 2, the oxide semiconductor transistor T further includes a first gate insulation layer 21, a second gate insulation layer 22, a third gate insulation layer 23, and a fourth gate insulation layer 24. The first insulation layer 21 is disposed between the first oxide semiconductor channel layer 41 and the first gate electrode G1. The second gate insulation layer 22 is disposed between the first oxide semiconductor channel layer 41 and the second gate electrode G2. The third gate insulation layer 23 is disposed between the second gate electrode G2 and the second oxide semiconductor channel layer 42. The fourth gate insulation layer 24 is disposed between the second oxide semiconductor channel layer 42 and the third gate electrode G3. The first gate insulation layer 21, the second gate insulation layer 22, the third gate insulation layer 23, and the fourth gate insulation layer 24 may respectively include an oxide layer such as a silicon oxide layer or other suitable insulating materials. It is worth noting that, in some embodiment, the first oxide semiconductor channel layer 41 may be thicker than the first gate insulation layer 21 and the second gate insulation layer 22 for further enhancing the on-current of the oxide semiconductor transistor T, and the second oxide semiconductor channel layer 42 may be thicker than the third gate insulation layer 23 and the fourth gate insulation layer 24 for the same purpose.

As shown in FIG. 1, the oxide semiconductor device 101 may further include a plurality of contact structures CS. Each of the contact structures CS penetrates an interlayer dielectric 12 covering at least a part of the oxide semiconductor transistor T and contacts one of the source/drain electrodes 50. In this embodiment, each of the contact structures CS may penetrate the interlayer dielectric 12 and the fourth gate insulation layer 24 for being connected to the corresponding source/drain electrode 50. The contact structures CS may include metal conductive materials such as aluminum, tungsten, copper, titanium, tantalum, titanium aluminide (TiAl), titanium nitride (TiN), tantalum nitride (TaN), and titanium aluminum oxide (TiAlO) or other suitable conductive materials. In some embodiments of the present invention, each of the source/drain electrodes 50 may include a first part P1 and a second part P2, a distance between the first part P1 of each of the source/drain electrodes 50 and the second gate electrode G2 is shorter than a distance between the second part P2 of each of the source/drain electrodes 50 and the second gate electrode G2. In other words, the first part P1 is closer to the second gate electrode G2 in comparison with the second part P2. The contact structures CS are disposed on the second parts P2 of the source/drain electrodes 50. In some embodiments, each of the source/drain electrodes 50 may cover a side surface 41S of the first oxide semiconductor channel layer 41 in the first direction, the first part P1 of each of the source/drain electrodes 50 may be disposed on the first oxide semiconductor channel layer 41, and the second part P2 of each of the source/drain electrodes 50 may be disposed on the first gate insulation layer 21. The first part P1 and the second part P2 of the same source/drain electrode 50 may be directly connected to each other, and the second parts P2 of the source/drain electrodes 50 are lower than the first parts P1 of the source/drain electrodes 50 in the vertical direction D4.

Figure 3:
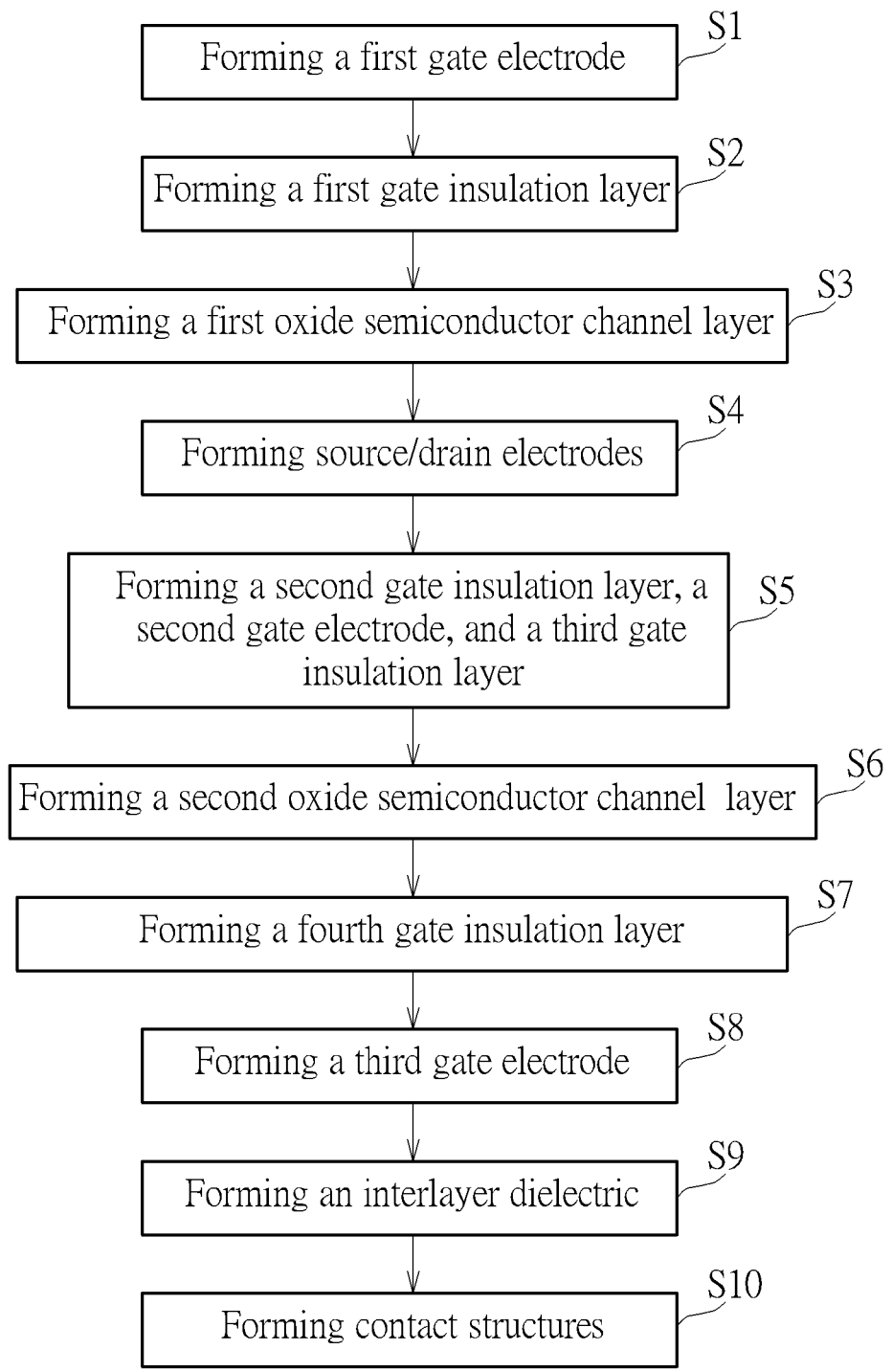
FIG. 3 is a flow chart of a manufacturing method of the oxide semiconductor device according to the first embodiment of the present invention.

Please refer to FIG. 1 and FIG. 3. FIG. 3 is a flow chart of a manufacturing method of the oxide semiconductor device 101 in this embodiment. The manufacturing method of the oxide semiconductor device 101 may include but is not limited to the following steps. As shown in FIG. 1 and FIG. 3, in step S1, the first gate electrode G1 is formed in a dielectric layer 11, and the dielectric layer 11 may be formed on a substrate (not shown). The substrate may include a semiconductor substrate, a glass substrate, a plastic substrate, a ceramic substrate, or substrates made of other suitable materials. The semiconductor substrate mentioned above may include a silicon substrate, an epitaxial silicon substrate, a silicon germanium substrate, a silicon carbide substrate, or a silicon-on-insulator (SOI) substrate, but not limited thereto. For example, in some embodiments, the substrate may be a semiconductor substrate, and at least one silicon-based field effect transistor (not shown) may be formed on the substrate before the step of forming the dielectric layer 11. Specifically, a plurality of the silicon-based field effect transistors and interconnection structures (not shown) may be formed on the substrate, and the first gate electrode G1 may be formed by a process of forming a part of the interconnection structure, so as to simplify the manufacturing processes, but not limited thereto.

In step S2, the first gate insulation layer 21 is formed on the dielectric layer 11 and the first gate electrode G1. In step S3, the first oxide semiconductor channel layer 41 is formed on the first gate insulation layer 21. In step S4, the source/drain electrodes 50 are formed on the first oxide semiconductor channel layer 41. In this embodiment, each of the source/drain electrodes 50 may be partly formed on the first oxide semiconductor channel layer 41 and partly formed on the first gate insulation layer 21, and the side surface 41S of the first oxide semiconductor channel layer 41 may be covered by the source/drain electrodes 50, but not limited thereto. In step S5, the second gate insulation layer 22, the second gate electrode G2, and the third gate insulation layer 23 are formed on the first oxide semiconductor channel layer 41 and the source/drain electrodes 50. In step S6, the second oxide semiconductor channel layer 42 is formed on the third gate insulation layer 23 and the source/drain electrodes 50. The first oxide semiconductor channel layer 41 and the second oxide semiconductor channel layer 42 may be respectively formed by a physical vapor deposition (PVD) process, a chemical vapor deposition process, or other suitable processes. In step S7, the fourth gate insulation layer 24 is formed on the second oxide semiconductor channel layer 42 and the source/drain electrodes 50. In step S8, the third gate electrode G3 is formed on the fourth gate insulation layer 24. In step S9, the interlayer dielectric 12 is formed to cover the transistor T. In step S10, the contact structures CS are formed penetrating the interlayer dielectric 12 and the fourth gate insulation layer 24 for being connected to the source/drain electrodes 50. It is worth noting that the manufacturing method of the oxide semiconductor device 101 is not limited to the approaches mentioned above, and other appropriate processes and/or different process sequences may also be used to form the oxide semiconductor device 101.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
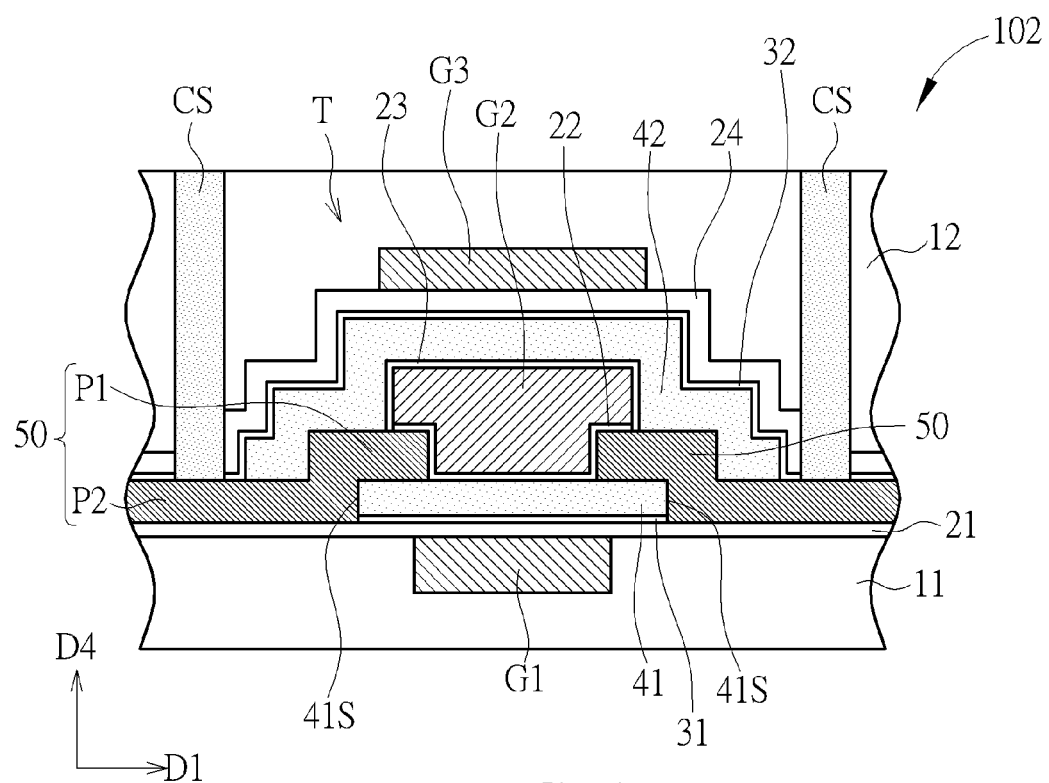
FIG. 4 is a schematic drawing illustrating an oxide semiconductor device according to a second embodiment of the present invention.

Please refer to FIG. 4. FIG. 4 is a schematic drawing illustrating an oxide semiconductor device 102 according to a second embodiment of the present invention. As shown in FIG. 4, the difference between the oxide semiconductor device 102 in this embodiment and the oxide semiconductor device in the first embodiment mentioned above is that the oxide semiconductor transistor T in this embodiment further includes a first interface layer 31 disposed between the first gate insulation layer 21 and the first oxide semiconductor channel layer 41. A lattice mismatch between the first interface layer 31 and the first oxide semiconductor channel layer 41 is lower than a lattice mismatch between the first gate insulation layer 21 and the first oxide semiconductor channel layer 41 for improving the performance of the oxide semiconductor device 102. Additionally, the oxide semiconductor transistor T in this embodiment may further include a second interface layer 32 disposed between the fourth gate insulation layer 24 and the second oxide semiconductor channel layer 42. A lattice mismatch between the second interface layer 32 and the second oxide semiconductor channel layer 42 is lower than a lattice mismatch between the fourth gate insulation layer 24 and the second oxide semiconductor channel layer 42. The first interface layer 31 and the second interface layer 32 may be an oxide insulation material or other appropriate insulation material. In some embodiments of the present invention, other interface layers may also be disposed between the second gate insulation layer 22 and the first oxide semiconductor channel layer 41 and/or be disposed between the third gate insulation layer 23 and the second oxide semiconductor channel layer 42 for improving the performance of the oxide semiconductor device 102. In this embodiment, a part of the second interface layer 32 is disposed on the source/drain electrodes 50, and the contact structures CS penetrate the interlayer dielectric 12, the fourth gate insulation layer 24, and the second interface layer 32 for being connected to the source/drain electrodes 50, but not limited thereto. In some embodiments of the present invention, the second interface layer 32 and the fourth gate insulation layer 24 may be disposed only between the third gate electrode G3 and the second oxide semiconductor channel layer 42. The interface layers in this embodiment may also be optionally applied to other embodiments of the present invention.

Figure 5:
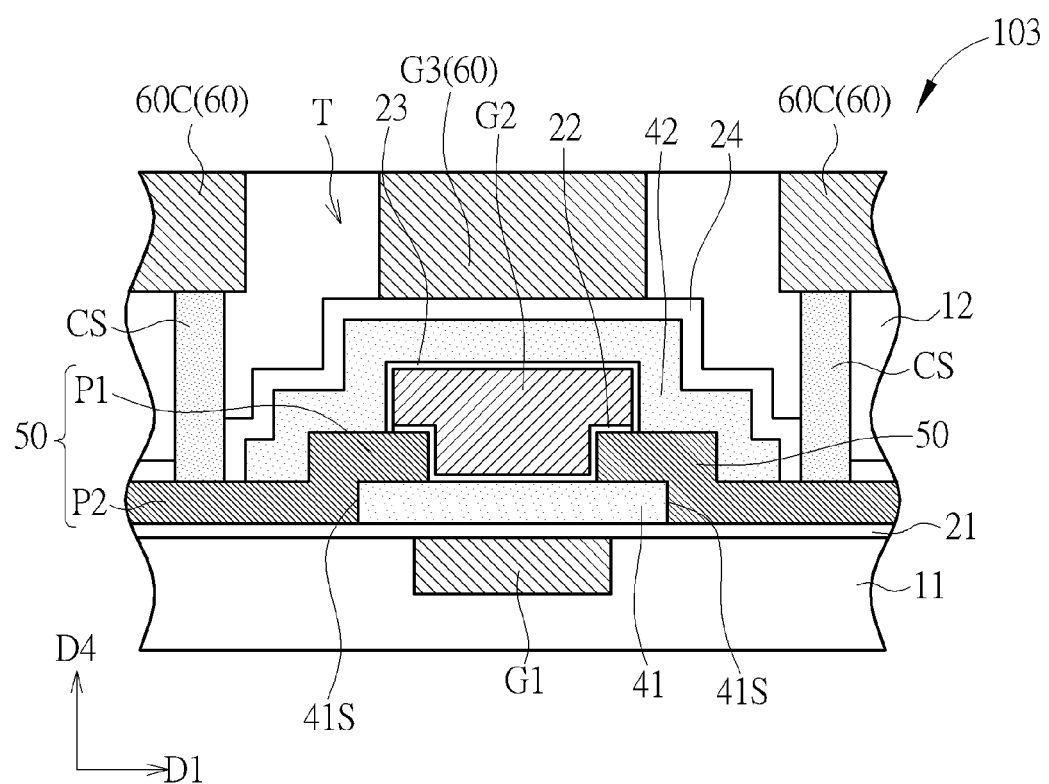
FIG. 5 is a schematic drawing illustrating an oxide semiconductor device according to a third embodiment of the present invention.

Please refer to FIG. 5. FIG. 5 is a schematic drawing illustrating an oxide semiconductor device 103 according to a third embodiment of the present invention. As shown in FIG. 5, the difference between the oxide semiconductor device 103 in this embodiment and the oxide semiconductor device in the first embodiment mentioned above is that the oxide semiconductor device 103 further includes an interconnection structure 60C disposed on the contact structures CS. The third gate electrode G3 and the interconnection structure 60C may be formed by one identical patterned conductive layer 60 in the interlayer dielectric 12 for simplifying the manufacturing processes, but not limited thereto. For example, a dual damascene process may be used to form the contact structures CS, the interconnection structure 60C, and the third gate electrode G3.

Figure 6:
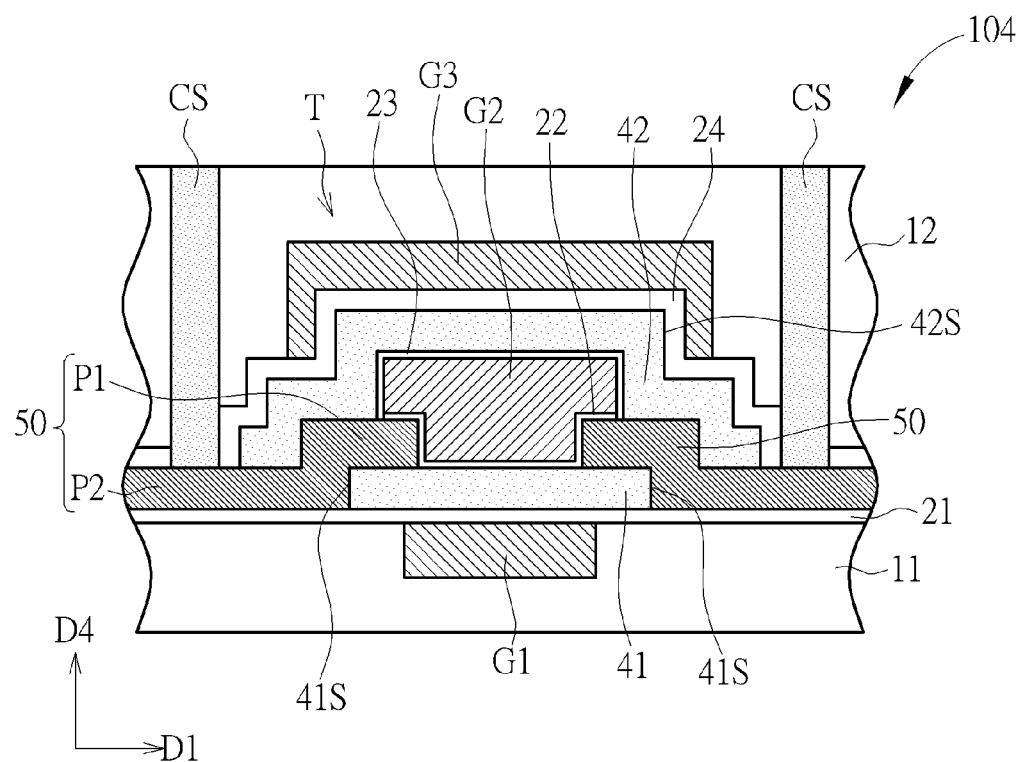
FIG. 6 is a schematic drawing illustrating an oxide semiconductor device according to a fourth embodiment of the present invention.

Please refer to FIG. 6. FIG. 6 is a schematic drawing illustrating an oxide semiconductor device 104 according to a fourth embodiment of the present invention. As shown in FIG. 6, the difference between the oxide semiconductor device 104 in this embodiment and the oxide semiconductor device in the first embodiment mentioned above is that the third gate electrode G3 in this embodiment may cover at least a part of a side surface 42S of the second oxide semiconductor channel layer 42 in a horizontal direction (such as the first direction D1 shown in FIG. 6) for further improving the control capability of the third gate electrode G3. The side surface 42S of the second oxide semiconductor channel layer 42 is directly connected with the fourth gate insulation layer 24, and a part of the fourth gate insulation layer 24 is disposed between the third gate electrode G3 and the second oxide semiconductor channel layer 42 in the horizontal direction. The structure of the third gate electrode G3 in this embodiment may also be optionally applied to other embodiments of the present invention.

Figure 7:
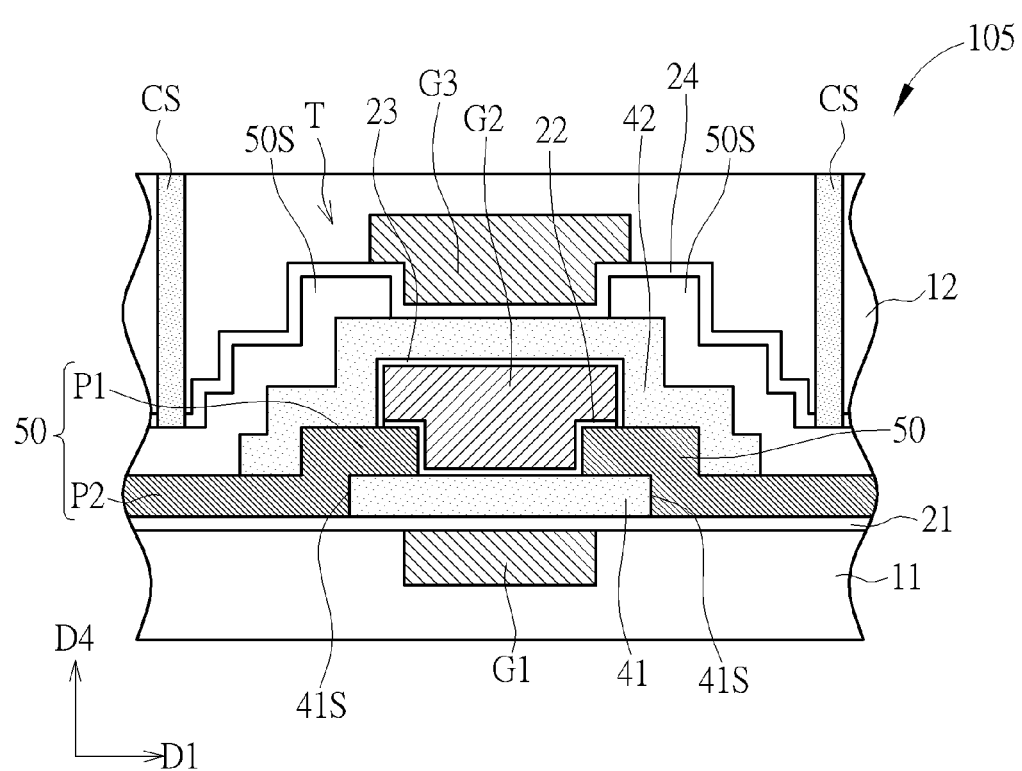
FIG. 7 is a schematic drawing illustrating an oxide semiconductor device according to a fifth embodiment of the present invention.

Please refer to FIG. 7. FIG. 7 is a schematic drawing illustrating an oxide semiconductor device 105 according to a fifth embodiment of the present invention. As shown in FIG. 7, the difference between the oxide semiconductor device 105 in this embodiment and the oxide semiconductor device in the first embodiment mentioned above is that the oxide semiconductor transistor T in this embodiment further includes two auxiliary electrodes 50S. Each of the auxiliary electrodes 50S is disposed on the second oxide semiconductor channel layer 42 and one of the source/drain electrodes 50. Each of the auxiliary electrodes 50S contacts and is electrically connected to the corresponding source/drain electrode 50. The auxiliary electrodes 50S in this embodiment may be used to improve the current driving capability of the source/drain electrodes 50. In this embodiment, each of the contact structures CS penetrates the interlayer dielectric 12 covering at least a part of the oxide semiconductor transistor T and other materials on the auxiliary electrodes 50S (such as the fourth gate insulation layer 24 on the auxiliary electrodes 50S) for contacting one of the auxiliary electrodes 50S. Each of the contact structures CS is electrically connected to one of the source/drain electrodes 50 via the corresponding auxiliary electrode 50S. In this embodiment, a part of the second oxide semiconductor channel layer 42 is disposed between the second gate electrode G2 and each of the auxiliary electrodes 50S, and a part of the second oxide semiconductor channel layer 42 is disposed between each of the auxiliary electrodes 50S and the corresponding source/drain electrode 50. The auxiliary electrode 50S may be regarded as an extension part of the corresponding source/drain electrode 50 and may be used to increase the area of the second oxide semiconductor channel layer 42 connected with the source/drain of the oxide semiconductor transistor T. Additionally, the auxiliary electrode 50S in this embodiment may also be optionally applied to other embodiments of the present invention.

Figure 8:
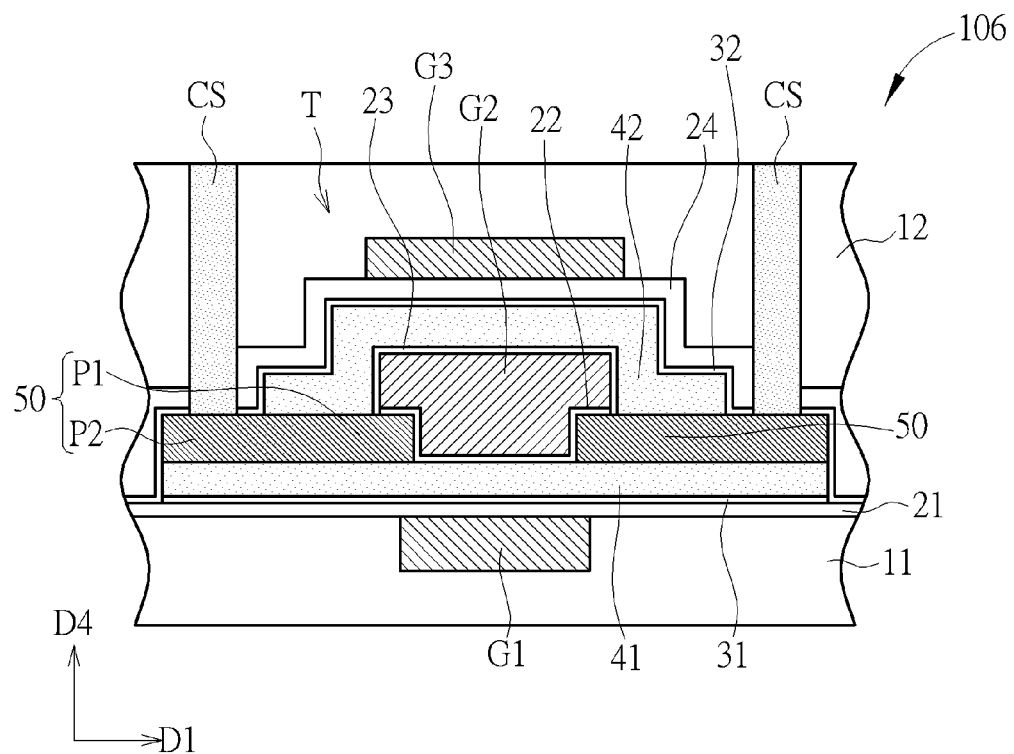
FIG. 8 is a schematic drawing illustrating an oxide semiconductor device according to a sixth embodiment of the present invention.

Please refer to FIG. 8. FIG. 8 is a schematic drawing illustrating an oxide semiconductor device 106 according to a sixth embodiment of the present invention. As shown in FIG. 8, the difference between the oxide semiconductor device 106 in this embodiment and the oxide semiconductor device in the second embodiment mentioned above is that, in this embodiment, the first parts P1 and the second parts P2 of the source/drain electrodes 50 are disposed on the first oxide semiconductor channel layer 41. In other words, the source/drain electrodes 50 may be disposed only on the first oxide semiconductor channel layer 41. In addition, an edge of the second part P2 of each of the source/drain electrodes 50 may be aligned with an edge of the first oxide semiconductor channel layer 41, and the second interface layer 32 in this embodiment may extent to be disposed on the side surfaces of the source/drain electrodes 50, the side surface of the first oxide semiconductor channel layer 41, and the first gate insulation layer 21 for being connected to the first interface layer 31, but not limited thereto.

Figure 9:
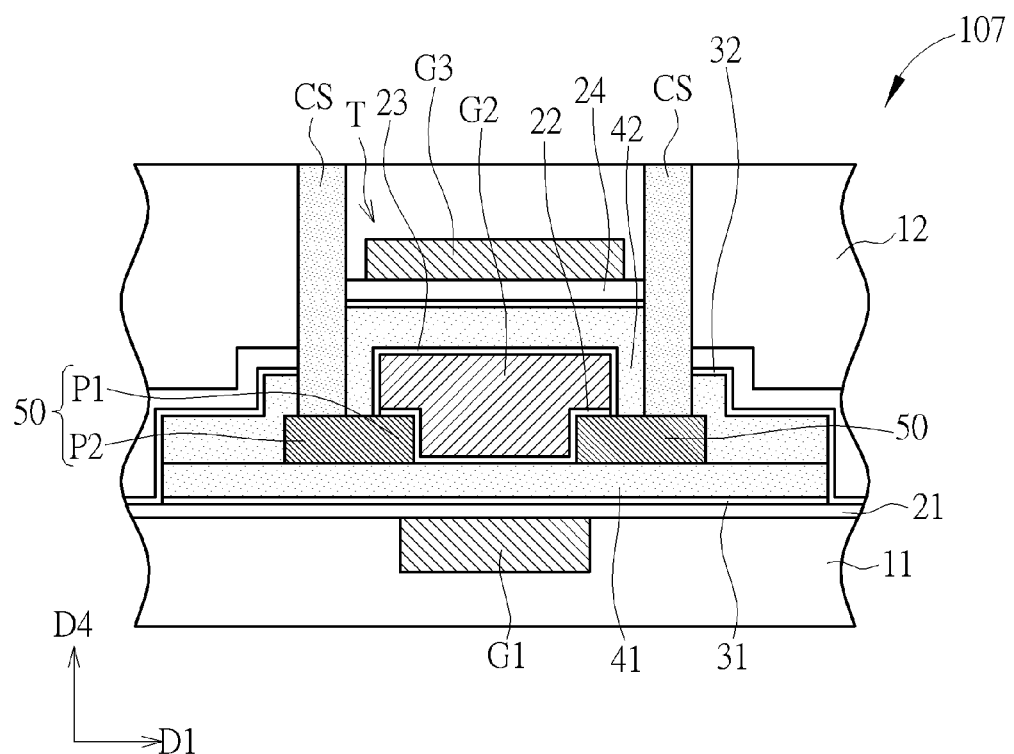
FIG. 9 is a schematic drawing illustrating an oxide semiconductor device according to a seventh embodiment of the present invention.

Please refer to FIG. 9. FIG. 9 is a schematic drawing illustrating an oxide semiconductor device 107 according to a seventh embodiment of the present invention. As shown in FIG. 9, the difference between the oxide semiconductor device 107 in this embodiment and the oxide semiconductor device in the sixth embodiment mentioned above is that, in this embodiment, the first parts P1 and the second parts P2 of the source/drain electrodes are covered by the second oxide semiconductor channel layer 42, and each of the contact structures CS further penetrates the second oxide semiconductor channel layer 42 for being connected to the source/drain electrodes 50. Additionally, a part of the second oxide semiconductor channel layer 42 may be directly connected to the first oxide semiconductor channel layer 41, and the first oxide semiconductor channel layer 41 and the second oxide semiconductor channel layer 42 may be formed by the same patterning process, but not limited thereto. Accordingly, an edge of the second oxide semiconductor channel layer 42 may be aligned with an edge of the first oxide semiconductor channel layer 41, and the edge of the second oxide semiconductor channel layer 42 and the edge of the first oxide semiconductor channel layer 41 may directly contact each other.

To summarize the above descriptions, in the oxide semiconductor device of the present invention, the oxide semiconductor transistor two oxide semiconductor channel layers and three gate electrode for enhancing the on-current of the oxide semiconductor transistor. The third gate electrode and the first gate electrode may be used to provide bias voltage for adjusting the threshold voltage of the oxide semiconductor transistor. The electrical performance of the oxide semiconductor transistor may be improved, and the application field of the oxide semiconductor device may be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An oxide semiconductor device, comprising:
an oxide semiconductor transistor, comprising:
  a first gate electrode;
  a second gate electrode disposed above the first gate electrode;
  a third gate electrode disposed above the second gate electrode;
  a first oxide semiconductor channel layer, wherein at least a part of the first oxide semiconductor channel layer is disposed between the first gate electrode and the second gate electrode;
  a second oxide semiconductor channel layer, wherein at least a part of the second oxide semiconductor channel layer is disposed between the second gate electrode and the third gate electrode;
  two source/drain electrodes, wherein at least a part of each of the source/drain electrodes is disposed between the first oxide semiconductor channel layer and the second oxide semiconductor channel layer, and each of the source/drain electrodes physically contacts the first oxide semiconductor channel layer and the second oxide semiconductor channel layer; and
  two auxiliary electrodes, wherein each of the auxiliary electrodes is disposed on the second oxide semiconductor channel layer and one of the source/drain electrodes, and each of the auxiliary electrodes contacts and is electrically connected to the corresponding source/drain electrode.

2. The oxide semiconductor device of claim 1, wherein the oxide semiconductor transistor further comprises:
  a first gate insulation layer disposed between the first oxide semiconductor channel layer and the first gate electrode;
  a second gate insulation layer disposed between the first oxide semiconductor channel layer and the second gate electrode;
  a third gate insulation layer disposed between the second gate electrode and the second oxide semiconductor channel layer; and a fourth gate insulation layer disposed between the second oxide semiconductor channel layer and the third gate electrode.

3. The oxide semiconductor device of claim 2, wherein the oxide semiconductor transistor further comprises:
a first interface layer disposed between the first gate insulation layer and the first oxide semiconductor channel layer, wherein a lattice mismatch between the first interface layer and the first oxide semiconductor channel layer is lower than a lattice mismatch between the first gate insulation layer and the first oxide semiconductor channel layer.

4. The oxide semiconductor device of claim 2, wherein the oxide semiconductor transistor further comprises:
a second interface layer disposed between the fourth gate insulation layer and the second oxide semiconductor channel layer, wherein a lattice mismatch between the second interface layer and the second oxide semiconductor channel layer is lower than a lattice mismatch between the fourth gate insulation layer and the second oxide semiconductor channel layer.

5. The oxide semiconductor device of claim 2, wherein the first oxide semiconductor channel layer is thicker than the first gate insulation layer and the second gate insulation layer.

6. The oxide semiconductor device of claim 2, wherein the second oxide semiconductor channel layer is thicker than the third gate insulation layer and the fourth gate insulation layer.

7. The oxide semiconductor device of claim 1, further comprising:
a plurality of contact structures, wherein each of the contact structures penetrates an interlayer dielectric covering at least a part of the oxide semiconductor transistor.

8. The oxide semiconductor device of claim 7, wherein each of the source/drain electrodes comprises a first part and a second part, a distance between the first part of each of the source/drain electrodes and the second gate electrode is shorter than a distance between the second part of each of the source/drain electrodes and the second gate electrode, and the contact structures are disposed on the second parts of the source/drain electrodes.

9. The oxide semiconductor device of claim 8, wherein each of the source/drain electrodes covers a side surface of the first oxide semiconductor channel layer, and the second parts of the source/drain electrodes are lower than the first parts of the source/drain electrodes.

10. The oxide semiconductor device of claim 8, wherein the first parts and the second parts of the source/drain electrodes are disposed on the first oxide semiconductor channel layer.

11. The oxide semiconductor device of claim 1, further comprising:
a plurality of contact structures, wherein each of the contact structures penetrates an interlayer dielectric covering at least a part of the oxide semiconductor transistor and contacts one of the auxiliary electrodes.

12. The oxide semiconductor device of claim 11, wherein each of the contact structures is electrically connected to one of the source/drain electrodes via the corresponding auxiliary electrode.

13. The oxide semiconductor device of claim 11, wherein a part of the second oxide semiconductor channel layer is disposed between the second gate electrode and each of the auxiliary electrodes.

14. The oxide semiconductor device of claim 11, wherein a part of the second oxide semiconductor channel layer is disposed between each of the auxiliary electrodes and the corresponding source/drain electrode.

* * * * *